United States Patent
Choi

(10) Patent No.: US 7,148,112 B2
(45) Date of Patent: Dec. 12, 2006

(54) METHOD FOR MANUFACTURING SEMICONDUCTOR DEVICE INCLUDING A RECESS CHANNEL

(75) Inventor: Kang Sik Choi, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 91 days.

(21) Appl. No.: 11/121,652

(22) Filed: May 4, 2005

(65) Prior Publication Data
US 2006/0141757 A1 Jun. 29, 2006

(30) Foreign Application Priority Data
Dec. 29, 2004 (KR) .................. 10-2004-0114759

(51) Int. Cl.
*H01L 21/336* (2006.01)
*H01L 21/4763* (2006.01)
(52) U.S. Cl. .............. 438/270; 438/589; 257/E21.429
(58) Field of Classification Search .......... 438/270, 438/589; 257/E21.429
See application file for complete search history.

(56) References Cited
U.S. PATENT DOCUMENTS

| | | | |
|---|---|---|---|
| 6,093,947 A * | 7/2000 | Hanafi et al. | 257/330 |
| 6,486,035 B1 * | 11/2002 | Chun | 438/296 |
| 6,569,737 B1 * | 5/2003 | Park et al. | 438/270 |
| 6,927,139 B1 * | 8/2005 | Tanaka et al. | 438/294 |
| 7,041,538 B1 * | 5/2006 | Ieong et al. | 438/151 |
| 7,094,644 B1 * | 8/2006 | Kim | 438/259 |
| 2002/0094622 A1 * | 7/2002 | Sneelal et al. | 438/197 |
| 2005/0233513 A1 * | 10/2005 | Kim et al. | 438/197 |

* cited by examiner

*Primary Examiner*—Michael Lebentritt
*Assistant Examiner*—Ron Pompey
(74) *Attorney, Agent, or Firm*—Ladas & Parry LLP

(57) ABSTRACT

Disclosed is a method for manufacturing a semiconductor device. The method includes the steps of preparing a semiconductor substrate, forming a buffer oxide layer, forming a hard mask layer on the buffer oxide layer, etching an exposed portion of the buffer oxide layer by using the hard mask layer, etching a substrate active area of an exposed recess channel forming area by using the isolation layer as an etching mask, removing a remaining buffer oxide layer, sequentially forming a gate oxide layer and a gate conductive layer on a resultant structure, etching the gate conductive layer and the gate oxide layer, thereby forming a gate, and forming a source/drain area in the substrate active area.

4 Claims, 6 Drawing Sheets

METHOD FOR MANUFACTURING SEMICONDUCTOR DEVICE INCLUDING A RECESS CHANNEL

BACKGROUND OF THE INVENTION

1. Field of the Invention

The present invention relates to a method for manufacturing a semiconductor device, and more particularly to a method for manufacturing a semiconductor device having a recess channel.

2. Description of the Prior Art

Recently, as a design rule of a MOSFET device has been significantly scaled down below 100 nm, a channel length of a semiconductor device is also significantly shortened. If the channel length is shortened, OFF leakage current of the MOSFET device may increase. In order to reduce the OFF leakage current of the MOSFET, it is necessary to increase the ion implantation dose implanted into a channel region. However, such an increase of the ion implantation dose may cause an increase of leakage current in a storage node junction, thereby shortening a data retention time.

Accordingly, the MOSFET device having a planar channel structure represents a limitation to obtain a cell threshold voltage require for a predetermined semiconductor device. For this reason, various studies and research have been actively performed in order to realize the MOSFET device having a recess channel capable of obtaining an effective channel length.

FIGS. 1A to 1D are sectional views illustrating a procedure for fabricating a semiconductor device having a conventional recess channel, and FIG. 2 is a sectional view illustrating a hard mask layer used for forming the conventional recess channel. Herein, FIGS. 1A to 1D are sectional views taken along line I–I' shown in FIG. 2.

Referring to FIG. 1A, a buffer oxide layer 3 is formed oh a semiconductor substrate 1 having an isolation layer 2 for defining an active layer. Then, a first hard mask layer 4 is formed on the buffer oxide layer 3. The first hard mask layer 4 is made from polysilicon. After that, a photoresist pattern (not shown) is formed on the first hard mask layer 4 to being expose a recess region.

Referring to FIG. 1B, the first hard mask layer 4 and the buffer oxide layer 3 are etched by using the photoresist pattern as an etching mask. Then, the remained photoresist pattern is removed.

Referring to FIG. 1C, predetermined portions of the semiconductor substrate 1 and the isolation layer 1, which are not covered with the first hard mask layer 4 after the first hard mask layer 4 and the buffer oxide layer 3 have been etched, and a substrate active area formed below the buffer oxide layer 3 are etched. At this time, since the first hard mask layer 4 is made from polysilicon, the first hard mask layer 4 is also removed when the substrate active area is etched. After that, the remaining buffer oxide layer is removed.

Referring to FIG. 1D, after forming a gate oxide layer 6 on a resultant substrate, a doped polysilicon layer 7, a tungsten silicide layer 8, and a second hard mask layer 9 are sequentially formed on the gate oxide layer 6. Then, the second hard mask layer 9 is patterned in the form of a gate. After that, the tungsten silicide layer 8, the doped polysilicon layer 7 and the gate oxide layer 6 are sequentially etched by using the patterned second hard mask layer 9 as an etching mask, thereby forming a gate 10.

After that, although it is not illustrated in figures, after forming a spacer at both sidewalls of the gate 10, an ion implantation process is carried out with respect to the substrate 1, thereby forming a source/drain area in the substrate active area formed at both sides of the gate 10 including the spacer. As a result, a MOSFET device having the recess channel can be obtained.

However, the method for fabricating the semiconductor device having the conventional recess channel has problems as follows:

As shown in FIG. 2, the first hard mask layer 4 is etched in such a manner that a gate forming area including an active area 1a corresponding to a recess channel forming area can be fully exposed. In addition, the etching process for the substrate active area is performed with respect to an open area 4a by using the isolation layer 2, which is an oxide layer, as an etching mask.

However, if the etching process is performed by using the isolation layer 2 as an etching mask, as shown in FIG. 1c, a predetermined portion of the substrate adjacent to the isolation layer 2 is not etched due to the profile of the isolation layer 2. Accordingly, a horn A is formed between the isolation layer 2 and a recessed substrate active area, so that a side channel is formed in the MOSFET device, degrading an efficiency of the recess channel. In order to remove the horn A, it is necessary to further perform the etching process. However, in this case, the recess forming process will be complicated due to the additional etching process.

In addition, as shown in FIG. 3, if a mask is misaligned when forming the photoresist pattern for the recess of the channel area, a predetermined portion B of the substrate may be unnecessarily etched, thereby causing the defect of the semiconductor device.

SUMMARY OF THE INVENTION

Accordingly, the present invention has been made to solve the above-mentioned problems occurring in the prior art, and an object of the present invention is to provide a method for manufacturing a semiconductor device, capable of preventing a horn from being created in the semiconductor device.

Another object of the present invention is to provide a method for manufacturing a semiconductor device, capable of preventing the defect of the semiconductor device caused by the misalignment of a mask.

In order to accomplish these objects, according to the present invention, there is provided a method for manufacturing a semiconductor device, the method comprising the steps of: preparing a semiconductor substrate formed with an isolation layer for defining active areas; forming a buffer oxide layer on an entire surface of the semiconductor substrate including the isolation layer; forming a hard mask layer on the buffer oxide layer in such a manner that a predetermined portion of the active area corresponding to a recess channel forming area and a predetermined portion of the buffer oxide layer adjacent to the active area are selectively exposed; etching an exposed portion of the buffer oxide layer by using the hard mask layer as an etching mask, and selectively etching a predetermined portion of the isolation layer formed below the buffer oxide layer corresponding to a depth of a recess channel to be formed; etching a substrate active area of an exposed recess channel forming area by using the isolation layer as an etching mask and removing the hard mask layer; removing a remaining buffer oxide layer; sequentially forming a gate oxide layer and a gate conductive layer on a resultant structure; etching the gate conductive layer and the gate oxide layer, thereby forming a gate; and forming a source/drain area in the substrate active area formed at both sides of the gate.

According to the preferred embodiment of the present invention, if a minimum feature size of the active area is F, the hard mask layer exposes a predetermined area, which is larger than F and smaller than 3F.

The substrate active area is etched such that a height of the active area is 0~300 Å higher than the etched portion of isolation layer.

According to the preferred embodiment of the present invention, a wet etching process is performed with respect to a resultant substrate in order to adjust a profile of the substrate active area, after etching the substrate active area and before removing the remaining buffer oxide layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the present invention will be described with reference to accompanying drawings.

Figure 1A:
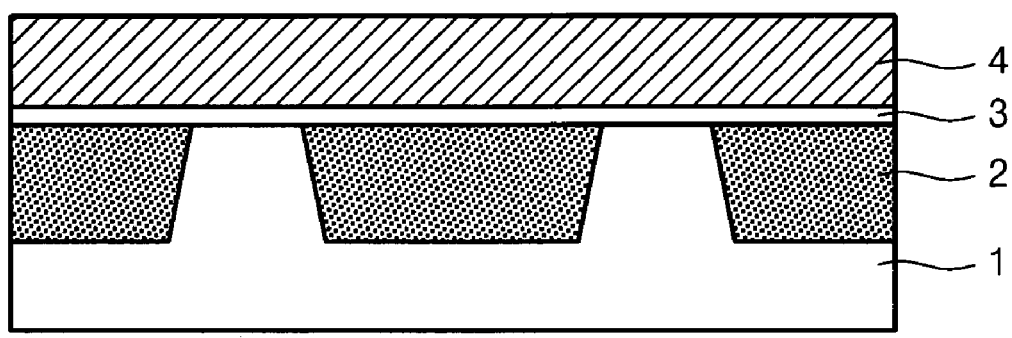
FIGS. 1A to 1D are sectional views illustrating a procedure for fabricating a semiconductor device having a conventional recess channel.
Figure 1B:
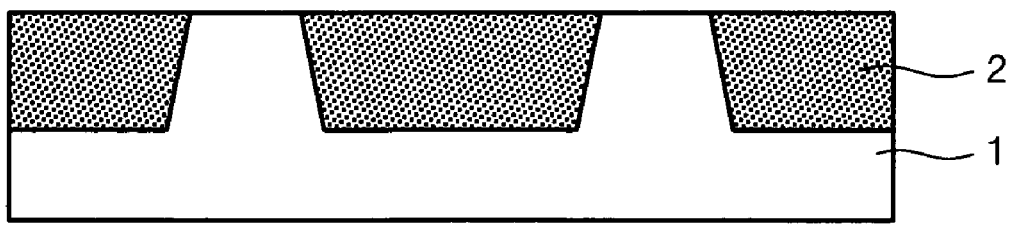
Figure 1C:
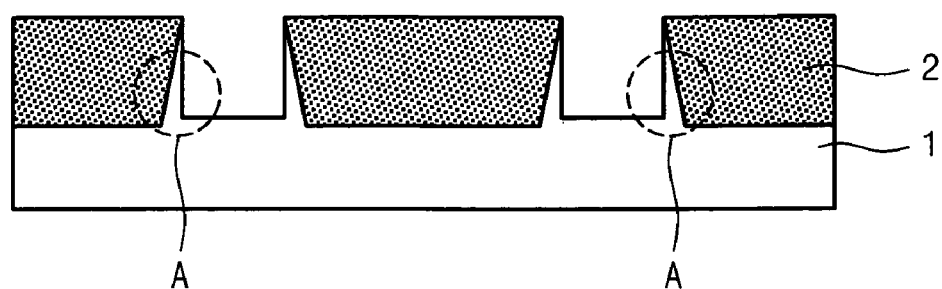
Figure 1D:
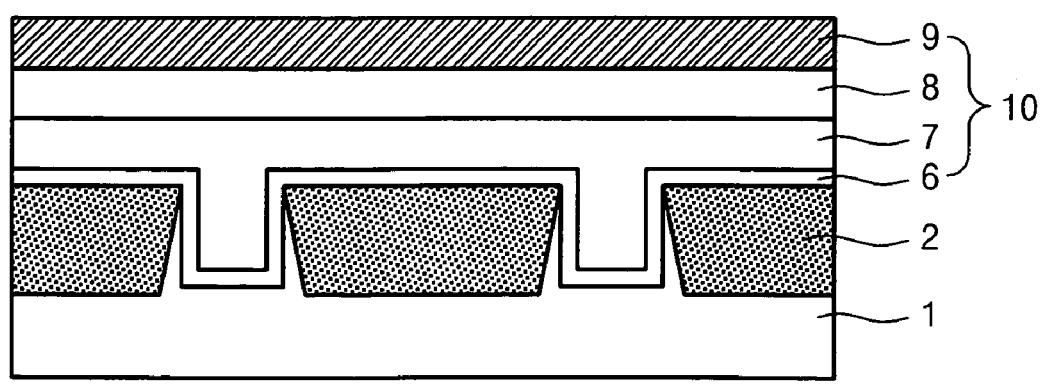
Figure 2:
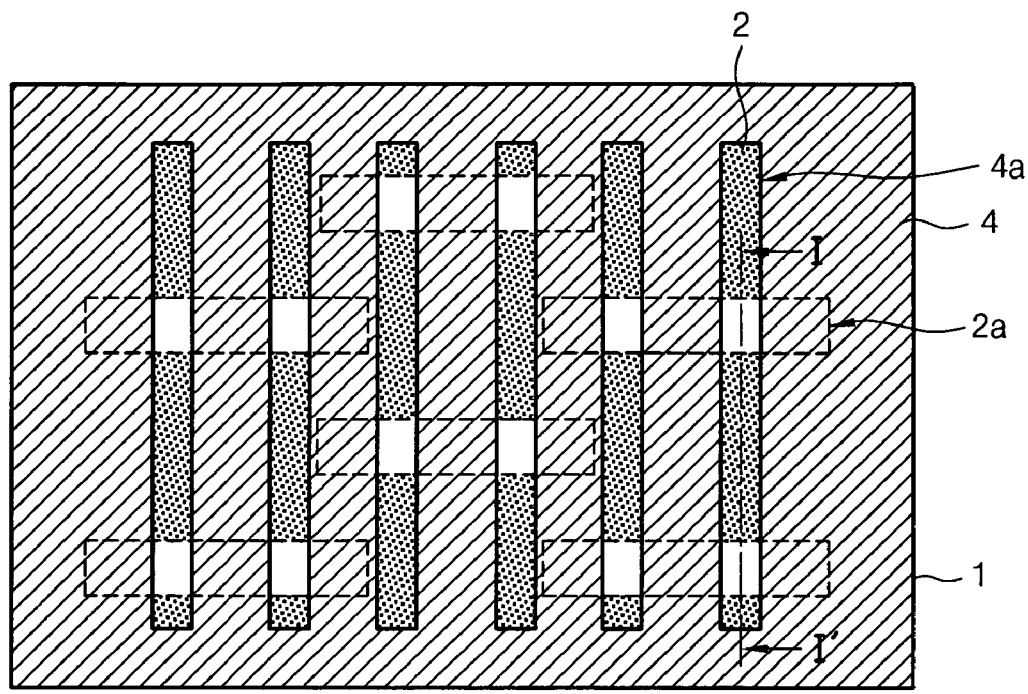
FIG. 2 is a sectional view illustrating a hard mask layer used for forming a conventional recess channel.
Figure 3:
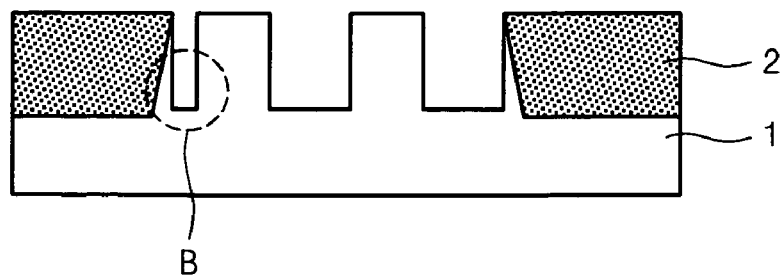
FIG. 3 is a sectional view illustrating a problem of a conventional art.
Figure 4A:
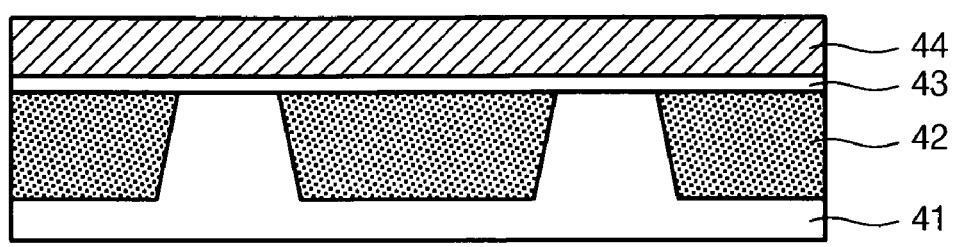
FIGS. 4A to 4E are sectional views illustrating a procedure for fabricating a semiconductor device according to one embodiment of the present invention.
Figure 4B:
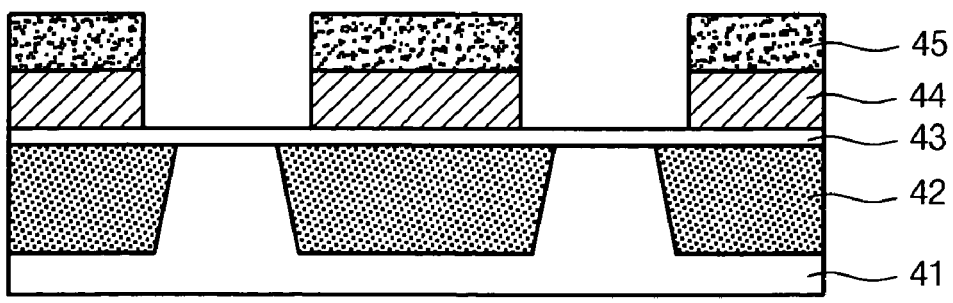
Figure 4C:
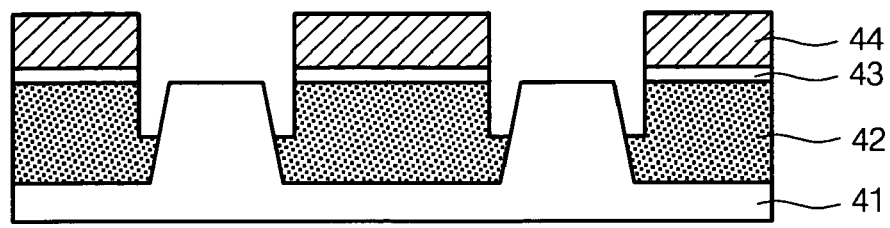
Figure 4D:
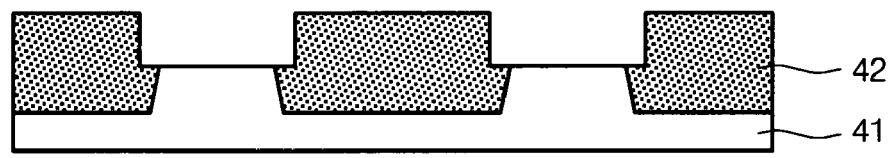
Figure 4E:
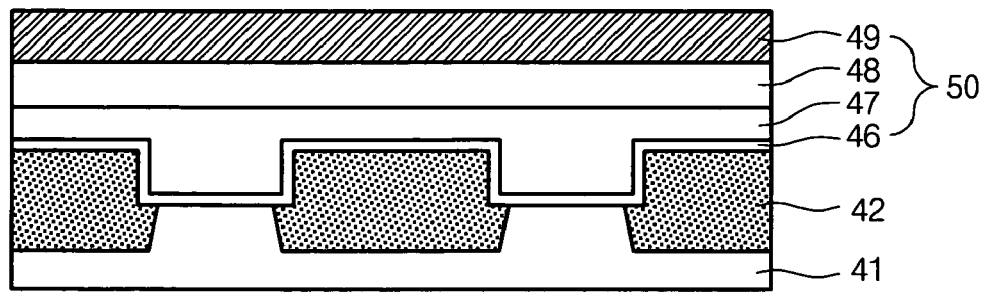
Figure 5:
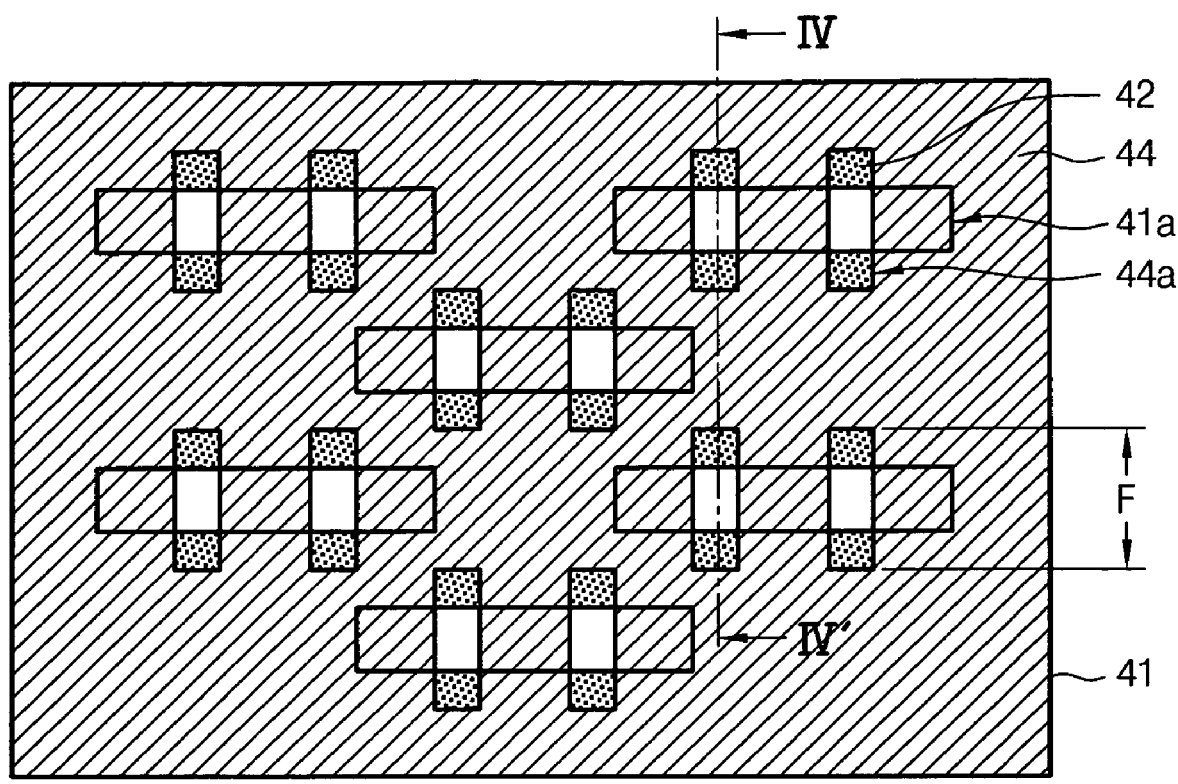
FIG. 5 is a sectional view illustrating a hard mask layer used for forming a recess channel according to one embodiment of the present invention.

FIGS. 4A to 4E are sectional views illustrating a procedure for fabricating a semiconductor device according to one embodiment of the present invention, and FIG. 5 is a sectional view illustrating a hard mask layer used for forming a recess channel according to one embodiment of the present invention. Herein, FIGS. 4A to 4E are sectional views taken along line IV–IV' shown in FIG. 5.

Referring to FIG. 4A, a semiconductor substrate 41 formed with an isolation layer 42 for defining active layers is prepared. The isolation layer 42 can be obtained by filling an oxide layer in a trench through an STI process. Then, after forming a buffer oxide layer 43 on an entire surface of the semiconductor substrate 41 including the isolation layer 42, a first hard mask layer 44 made from polysilicon is formed on the buffer oxide layer 43.

Referring to FIG. 4B, after forming a photoresist pattern 45 on the first hard mask layer 44, the first hard mask layer 44 is etched by using the photoresist pattern 45 as an etching mask.

Herein, differently from the conventional photoresist pattern, which fully exposes the gate forming area including the substrate active area corresponding to the recess channel forming area in order to form the recess channel, the photoresist pattern 45 according to the present invention may expose a predetermined portion of the substrate active area corresponding to the recess channel forming area and an upper portion of the isolation layer adjacent to the substrate active area. Accordingly, as shown in FIG. 5, if the first hard mask layer 44 is etched by using the photoresist pattern 45 as an etching mask, the first hard mask layer 44 has open regions 44a capable of selectively exposing predetermined portions of the substrate active area corresponding to the recess channel forming area and predetermined portions of the buffer oxide layer adjacent to the recess channel forming area. At this time, if a minimum feature size of the active area is F, the open region 44a has a size capable of exposing a predetermined area, which is larger than F and smaller than 3F.

Referring to FIG. 4C, after removing the photoresist pattern, the exposed portion of the buffer oxide layer is etched by using the etched first hard mask layer 44 as an etching mask. In addition, the isolation layer formed below the buffer oxide layer is etched corresponding to a depth of a recess channel to be formed.

Referring to FIG. 4D, a predetermined portion of the substrate active area which corresponds to the exposed recess channel forming area is etched by using the isolation layer 42 consisting of an oxide material as an etching mask, such that the substrate active area is 0~300 Å higher than the etched portion of the isolation layer 42, thereby forming a stepped portion having a predetermined gradient in the substrate channel forming area. At this time, since the first hard mask layer 44 is made from polysilicon, the first hard mask layer 44 is also removed when the substrate active area is etched. After that, a wet etching process is carried out with respect to the resultant substrate in order to adjust a profile of the active area. Then, the remaining buffer oxide layer is removed.

According to the present invention, since the substrate active layer is etched after the isolation layer has been etched, it is possible to prevent a horn from being created between the isolation layer and the substrate active area. Therefore, the side channel caused by the horn cannot be formed in the MOSFET device, thereby improving the efficiency of the recess channel.

After that, impurities are implanted into the substrate 41, thereby forming a well (not shown) in the substrate 41. Then, an impurity implantation process is further carried out in order to adjust a threshold voltage of the MOSFET device.

Referring to FIG. 4E, after forming a gate oxide layer 46 on the resultant substrate, a doped polysilicon layer 47 and a tungsten silicide layer 48 are sequentially formed on the gate oxide layer 46 as a gate conductive layer. Then, a second hard mask layer 48 is formed on the tungsten silicide layer 48 and the second hard mask layer 48 is patterned in the form of a gate. Thereafter, the tungsten silicide layer 48, the doped polysilicon layer 47 and the gate oxide layer 46 are sequentially etched by using the patterned second hard mask layer 49 as an etching mask, thereby forming a gate 50.

After that, although it is not illustrated in figures, after forming a spacer made from a nitride material at both sidewalls of the gate 50, impurities are implanted into the substrate, thereby forming a source/drain area at both sides of the gate 50 including the spacer. As a result, the MOSFET device according to the present invention can be obtained.

As described above, according to the present invention, the photoresist pattern for recessing the substrate may not exist on the isolation layer region formed between adjacent active areas. In addition, since the predetermined portion of the substrate active area corresponding to the recess channel forming area is etched after partially etching the isolation layer, it is possible to prevent the horn from being created between the isolation layer and the recessed substrate active area. In addition, the substrate is prevented from being unnecessarily etched even if the mask is misaligned.

Therefore, according to the present invention, the OFF leakage current of the MOSFET device can be reduced and the channel length adaptable for a highly integrated device can be obtained. In addition, since the leakage current of the storage node junction can be reduced, the data retention time may increase while preventing the defect of the semiconductor substrate occurring when the semiconductor substrate is unnecessarily etched.

Furthermore, since the side channel is not created in the MOSFET device, it is possible to adjust the threshold voltage of the MOSFET device with a low channel dose. Accordingly, the characteristics of the semiconductor device can be improved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for manufacturing a semiconductor device, the method comprising the steps of:
   i) preparing a semiconductor substrate formed with an isolation layer for defining active areas;
   ii) forming a buffer oxide layer on an entire surface of the semiconductor substrate including the isolation layer;
   iii) forming a hard mask layer on the buffer oxide layer in such a manner that a predetermined portion of the active area corresponding to a recess channel forming area and a predetermined portion of the buffer oxide layer adjacent to the active area are selectively exposed;
   iv) etching an exposed portion of the buffer oxide layer by using the hard mask layer as an etching mask, and selectively etching a predetermined portion of the isolation layer formed below the buffer oxide layer corresponding to a depth of a recess channel to be formed;
   v) etching a substrate active area of an exposed recess channel forming area by using the isolation layer as an etching mask and removing the hard mask layer;
   vi) removing a remaining buffer oxide layer;
   vii) sequentially forming a gate oxide layer and a gate conductive layer on a resultant structure;
   viii) etching the gate conductive layer and the gate oxide layer, thereby forming a gate; and
   ix) forming a source/drain area in the substrate active area formed at both sides of the gate.

2. The method as claimed in claim 1, wherein, if a minimum feature size of the active area is F, the hard mask layer exposes a predetermined area, which is larger than F and smaller than 3F.

3. The method as claimed in claim 1, wherein the step of etching the substrate active area is performed such that a height of the active area is 0~300 Å higher than the etched portion of isolation layer.

4. The method as claimed in claim 1, further comprising a step of performing a wet etching process with respect to a resultant substrate in order to adjust a profile of the substrate active area, after etching the substrate active area and before removing the remaining buffer oxide layer.

* * * * *